US012648129B2

(12) United States Patent
Zhang

(10) Patent No.: US 12,648,129 B2
(45) Date of Patent: Jun. 2, 2026

(54) SEMICONDUCTOR STRUCTURE AND METHOD FOR FORMING THE SAME

(71) Applicant: Fujian Jinhua Integrated Circuit Co., Ltd., Quanzhou City (CN)

(72) Inventor: Janbo Zhang, Quanzhou City (CN)

(73) Assignee: Fujian Jinhua Integrated Circuit Co., Ltd.

( * ) Notice: Subject to any disclaimer, the term of this patent is extended or adjusted under 35 U.S.C. 154(b) by 421 days.

(21) Appl. No.: 18/204,397

(22) Filed: Jun. 1, 2023

(65) Prior Publication Data

US 2024/0276708 A1 Aug. 15, 2024

(30) Foreign Application Priority Data

Feb. 10, 2023 (CN) .......................... 202310108494.4
Feb. 10, 2023 (CN) .......................... 202320202480.4

(51) Int. Cl.
H10B 12/00 (2023.01)

(52) U.S. Cl.
CPC ....... H10B 12/482 (2023.02); H10B 12/0335 (2023.02); H10B 12/488 (2023.02); H10B 12/50 (2023.02)

(58) Field of Classification Search
CPC .. H10B 12/482; H10B 12/0335; H10B 12/50; H10B 12/488
See application file for complete search history.

(56) References Cited

U.S. PATENT DOCUMENTS 8,547,729 B2 * 10/2013 Huang ................... H10B 12/37
257/E27.092
9,741,723 B2 8/2017 Tomoyama 10,269,808 B2 4/2019 Kim
2014/0252536 A1 9/2014 Choi
2019/0341385 A1 11/2019 Liu
2021/0082924 A1 3/2021 Seong
2023/0020232 A1 * 1/2023 Shao .................... H10B 12/482

FOREIGN PATENT DOCUMENTS

CN 111640751 A 9/2020
CN 111710678 B 3/2022
CN 114388446 A 4/2022
JP 2014-120652 A 6/2014
JP 2016-149409 A 8/2016
KR 10-2004-0057414 A 7/2004
KR 10-2008-0032644 A 4/2008
KR 10-2011-0076502 A 7/2011

* cited by examiner

*Primary Examiner* — Richard A Booth

(74) *Attorney, Agent, or Firm* — Winston Hsu

(57) ABSTRACT

A semiconductor structure includes a substrate having a peripheral region and a memory region. A plurality of bit lines are disposed on the substrate, extending along a first direction to pass through the peripheral region and the memory region, and arranged in parallel along a second direction, wherein the first direction and the second direction are is perpendicular. A plurality of insulating plugs and first spacer structures are alternately arranged along the first direction between the bit lines on the peripheral region. A plurality of conductive plugs and second spacer structures are alternately arranged along the first direction between the bit lines on the memory region. The first spacer structures and the second spacer structures comprise a same material, and along the first direction, widths of the second spacer structures are smaller than widths of the first spacer structures.

11 Claims, 15 Drawing Sheets

SEMICONDUCTOR STRUCTURE AND METHOD FOR FORMING THE SAME

BACKGROUND OF THE INVENTION

1. Field of the Invention

The present invention relates to a semiconductor structure and a method for forming the same. More particularly, the present invention relates to a semiconductor structure for a dynamic random access memory (DRAM) device and method for forming the same.

2. Description of the Prior Art

Dynamic Random Access Memory (DRAM) is a type of volatile memory that includes an array region consisting of multiple memory cells and a peripheral region consisting of control circuits. Each memory cell is composed of a transistor and a capacitor connected to the transistor, which is used to store or release electric charge under the control of the transistor, achieving the purpose of storing data. The control circuits use word lines (WLs) and bit lines (BLs) that span across the array region and are electrically connected to each memory cell to address each memory cell and control data access.

In advanced technologies, three-dimensional (3D) structures, such as buried word lines and stacked capacitors, are widely used to reduce the size of memory cells and increase the array density of DRAM devices. Stacked capacitors are arranged vertically on the substrate and have upward-extending electrodes, allowing them to occupy less substrate area and increase capacitance by adjusting the height of the electrodes. Currently, stacked capacitors are electrically connected to transistors in the substrate through storage node contact plugs that are positioned between bit lines. Ensuring proper electrical isolation between the contact plugs of the storage nodes and improving the electrical connection quality of the stacked capacitors is a significant concern in the field.

SUMMARY OF THE INVENTION

One objective of the present invention is to provide a semiconductor structure for a dynamic random access memory (DRAM) device and method for manufacturing the same.

One embodiment of the present invention provides a semiconductor structure including a substrate having a peripheral region and a memory region. A plurality of bit lines are disposed on the substrate, extending along a first direction to pass through the peripheral region and the memory region, and arranged in parallel along a second direction, wherein the first direction and the second direction are is perpendicular. A plurality of insulating plugs and first spacer structures are alternately arranged along the first direction between the bit lines on the peripheral region. A plurality of conductive plugs and second spacer structures are alternately arranged along the first direction between the bit lines on the memory region. The first spacer structures and the second spacer structures comprise a same material, and along the first direction, widths of the second spacer structures are smaller than widths of the first spacer structures.

Another embodiment of the present invention provides a method for forming a semiconductor structure. First, a substrate having a peripheral region and a memory region is provided. Next, a plurality of bit lines are formed on the substrate, extending along a first direction to pass through the peripheral region and the memory region, and are arranged in parallel along a second direction, wherein the first direction and the second direction are is perpendicular. Subsequently, a first dielectric material is formed and fills the spaces between the bit lines. After that, a plurality of first openings are formed in the first dielectric material to divide the first dielectric material into a plurality of insulating plugs that are separated from each other. Next, a second dielectric material is formed to fill the first openings to form a plurality of first spacer structures. The insulating plugs on the memory region are then removed to form a plurality of second openings, and a plurality of second spacer structures are formed by etching the sidewalls of the first spacer structures exposed from the second openings. Last, a conductive material is formed to fill the second openings to form a plurality of conductive plugs.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are provided to facilitate a better understanding of this embodiment and are incorporated as part of this specification. These drawings and descriptions are used to illustrate the principles of some embodiments. The relative dimensions and proportions of the drawing components may have been exaggerated or reduced for the sake of clarity and convenience. Identical reference numerals are used to denote corresponding or similar features in various embodiments.

FIG. 1 to FIG. 15 are schematic drawings illustrating the manufacturing steps for forming a semiconductor structure according to an embodiment of the present invention, wherein:

FIG. 1, FIG. 2, FIG. 4, FIG. 6, FIG. 9 and FIG. 12 are plane views of a portion of the semiconductor structure at different manufacturing steps;

FIG. 3 is a cross-sectional view of the semiconductor structure along line AA' shown in FIG. 2;

FIG. 5 shows a cross-sectional view of the semiconductor structure along line BB' shown in FIG. 4 on the left portion, and a cross-sectional view of the semiconductor structure along line CC' shown in FIG. 4 on the right portion.

FIG. 7 is a cross-sectional view of the semiconductor structure along line AA' shown in FIG. 6;

FIG. 8 shows a cross-sectional view of the semiconductor structure along line BB' shown in FIG. 6 on the left portion, and a cross-sectional view of the semiconductor structure along line CC' shown in FIG. 6 on the right portion;

FIG. 10 is a cross-sectional view of the semiconductor structure along line AA' shown in FIG. 9;

FIG. 11 shows a cross-sectional view of the semiconductor structure along line BB' shown in FIG. 9 on the left portion, and a cross-sectional view of the semiconductor structure along line CC' shown in FIG. 9 on the right portion;

FIG. 13 is a cross-sectional view of the semiconductor structure along line AA' shown in FIG. 12;

FIG. 14 shows a cross-sectional view of the semiconductor structure along line BB' shown in FIG. 12 on the left portion, and a cross-sectional view of the semiconductor structure along line CC' shown in FIG. 12 on the right portion; and FIG. 15 is an enlarged plane view of a region AR of the semiconductor structure shown in FIG. 12.

DETAILED DESCRIPTION

Figure 1:
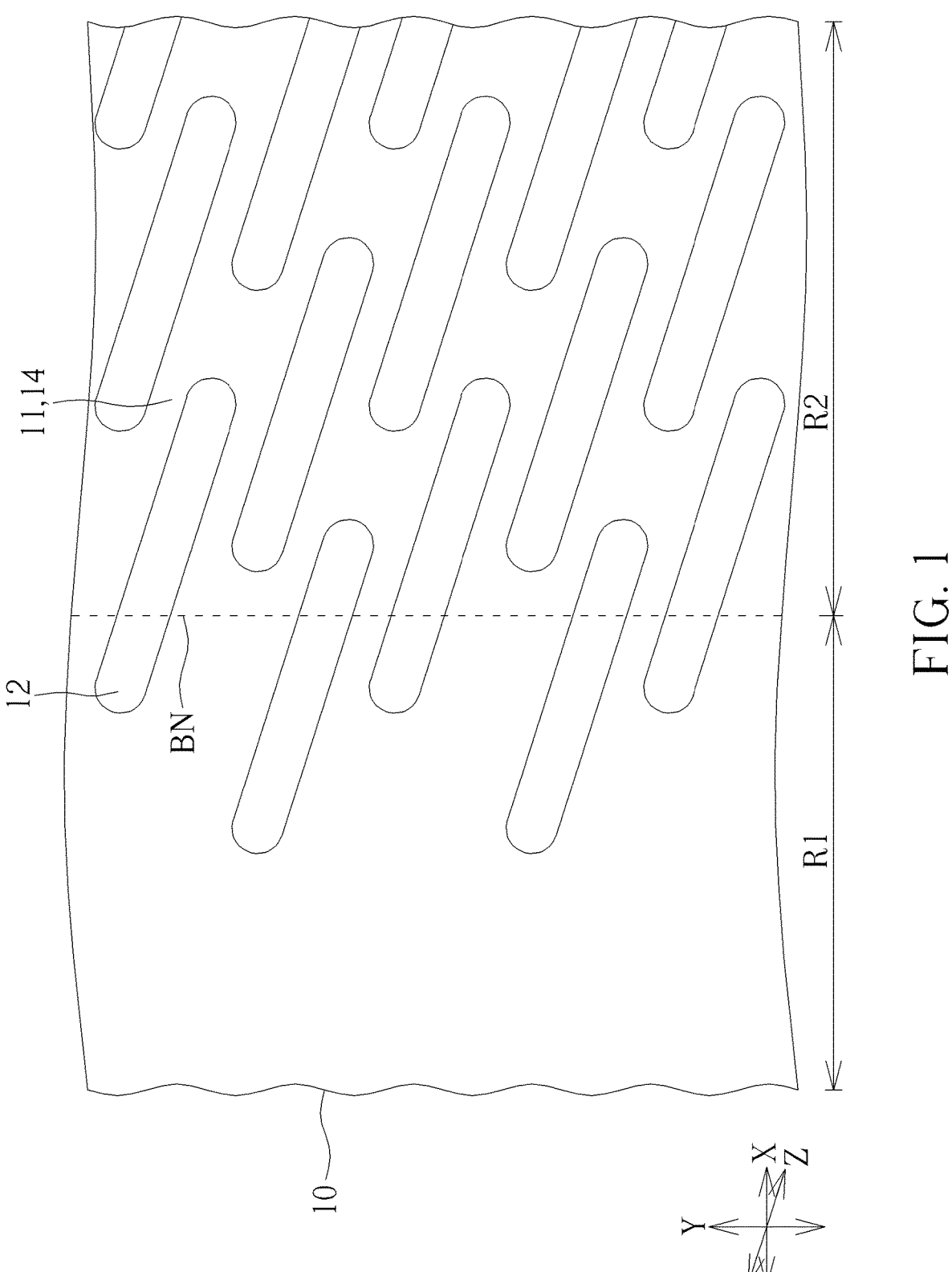

To provide a better understanding of the present invention to those of ordinary skill in the art, several exemplary embodiments of the present invention will be detailed as follows, with reference to the accompanying drawings using numbered elements to elaborate the contents and effects to be achieved. Other embodiments may be utilized and that structural, logical and electrical changes may be made without departing from the spirit and scope of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. Other embodiments may be utilized and that structural, logical and electrical changes may be made without departing from the spirit and scope of the present invention.

In order to simplify the drawings and clearly bring out the objective of the present invention, the drawings only depict parts of the semiconductor structure, and the elements in the drawings are not drawn to scale. The numbers and dimensions of the elements in the drawings are illustrative and are not intended to limit the scope of the present invention. Those skilled in the art should understand that this specification describes the structure according to the relative positions between the components, and is also applicable to describe the structure after being turned over or flipped, which should be included within the scope of the present invention.

Spatial reference directions, such as X, Y, and Z directions, are shown in the drawings for the convenience of description and a better understanding of the present invention, wherein the X direction and the Y direction are perpendicular to each other and are different from the Z direction. The X direction may also be referred to as the first direction. The Y direction may also be referred to as the second direction. The Z direction may also be referred to as the third direction.

FIG. 1 to FIG. 15 are schematic drawings illustrating the manufacturing steps for forming a semiconductor structure according to an embodiment of the present invention. First, as shown in FIG. 1, a substrate 10 is provided. The substrate 10 may be a silicon substrate, an epitaxial silicon substrate, a silicon-germanium substrate, a silicon carbide substrate, or a silicon-on-insulator (SOI) substrate, but is not limited thereto. The substrate 10 may include a peripheral region R1 and a memory region R2 that borders the peripheral region R1 at the boundary region BN. An insulating pad layer 10*a* (shown in FIG. 3), such as a silicon oxide layer ($SiO_2$) or a silicon nitride layer (SiN), may be disposed on the substrate 10. Next, the substrate 10 is etched to form isolation trenches 11 in the substrate 10 to define a plurality of active regions 12. Subsequently, a dielectric material is formed on the substrate 10 in a blanket manner to fill the isolation trenches 11, and the excess portions of the dielectric material outside the isolation trenches 11 are then removed, such that the isolation structures 14 in the isolation trenches 11 are obtained. The dielectric material of the isolation structures 14 may include silicon oxide ($SiO_2$), silicon nitride (SiN), silicon oxynitride (SiON), silicon carbide nitride (SiCN), nitrogen-doped silicon carbide (NDC), low dielectric constant (low-k) dielectric materials such as fluorinated silica glass (FSG), silicon carbon oxide (SiCOH), spin-on glass, porous low-k dielectric materials, organic polymer dielectric materials, or a combination thereof, but is not limited thereto. The active regions 12 are parallel, respectively have an elongated shape with the long axis extending along the Z direction, and are separated from each other by the isolation structures 14. The active regions 12 are arranged in a staggered manner to form a staggered array.

Figure 2:
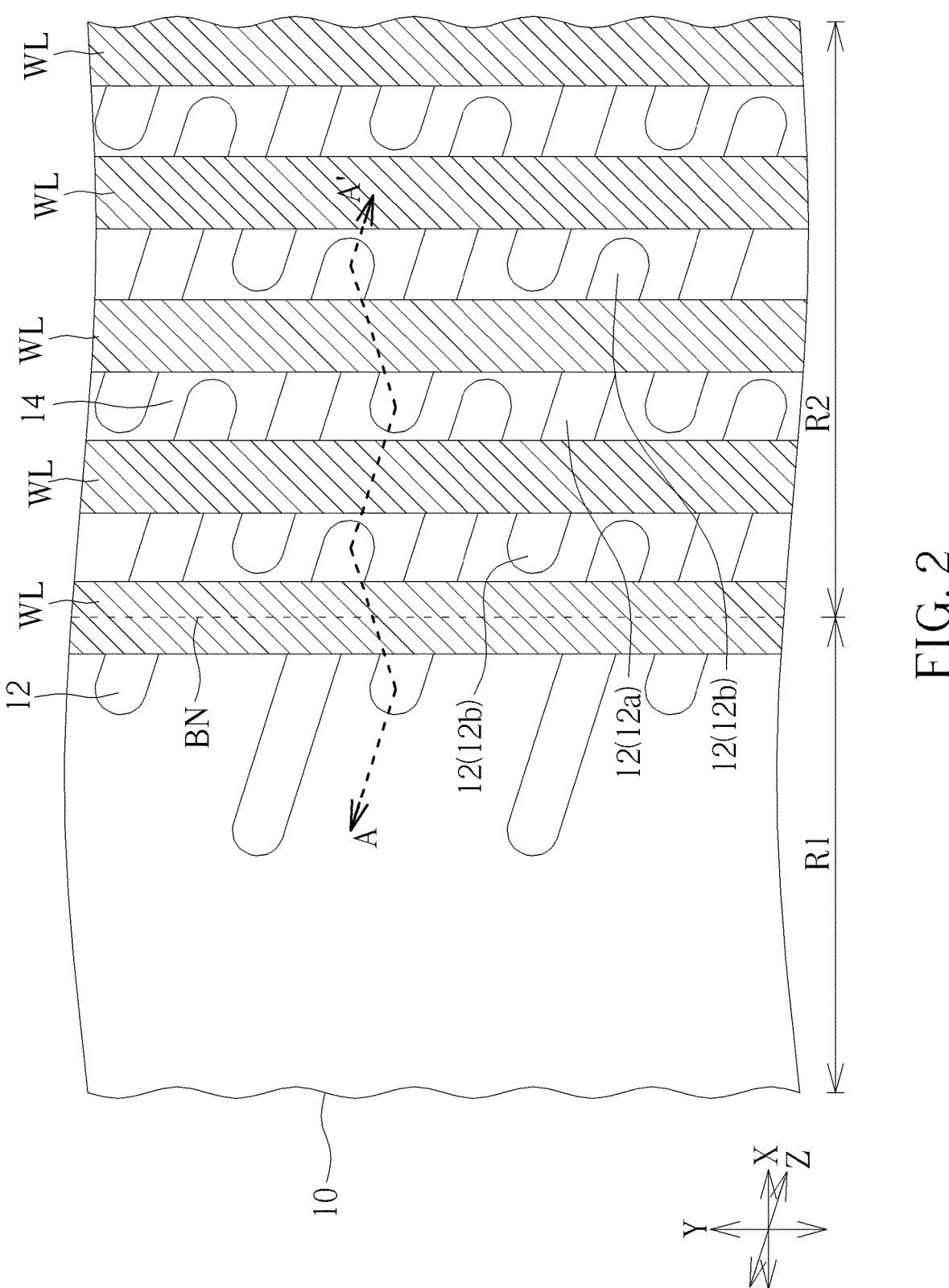
Figure 3:
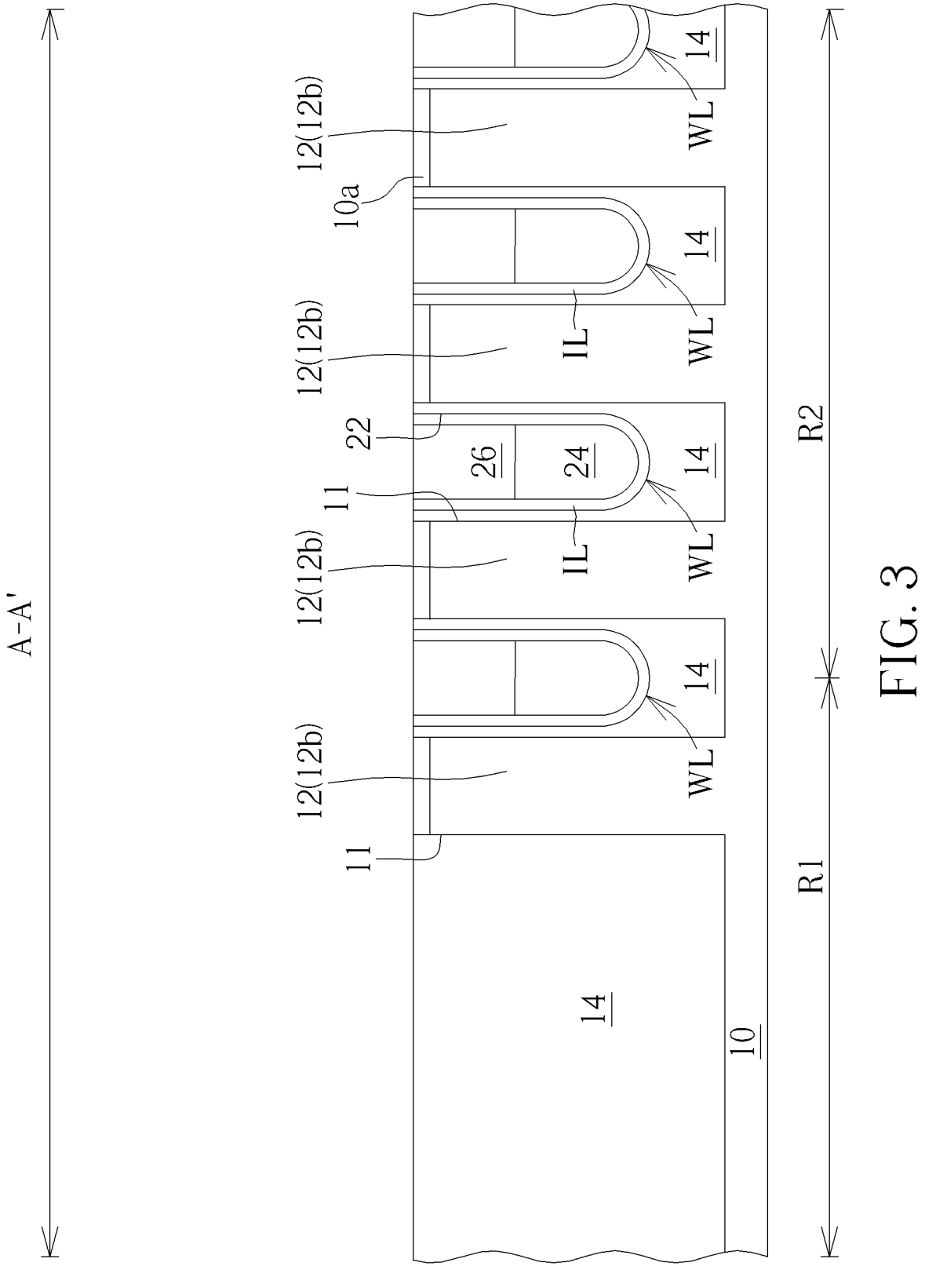

Please refer to FIG. 2 and FIG. 3. Subsequently, a plurality of buried word lines WL are formed in the memory region R2 of the substrate 10. The buried word lines WL respectively extend along the Y direction and are arranged parallel to each other along the X direction. According to some embodiments of the present invention, the angle between the X direction and the Z direction may be between 30 and 75 degrees. Each active region 12 is divided into a middle portion 12*a* and two terminal portions 12*b* by two adjacent word lines WL that intersect the active region 12. The word lines WL may be formed by the following steps. First, the substrate 100 may be etched to form a plurality of word line trenches 22 that cut through the isolation structures 14 and the active regions 12. Next, a gate dielectric layer IL is formed along bottom surface and sidewalls of each of the word line trenches 22. A conductive layer 24 is then formed on the gate dielectric layer IL and fills the lower portion of etch of the word line trenches 22. After that, an insulating cap layer 26 is formed on the conductive layer 24 and fills the lower portion of each of the word line trenches 22. The conductive layer 24 may include a metal material, such as tungsten (W), copper (Cu), aluminum (Al), titanium (Ti), tantalum (Ta), a work function metal, or a compound, alloy, and/or a composite layer of the above materials, but is not limited thereto. The insulating cap layer 26 and gate dielectric layer IL may respectively include a dielectric material, such as silicon dioxide ($SiO_2$), silicon nitride (SiN), silicon oxynitride (SiON), silicon carbide (SiCN), a high-k dielectric material, or a combination of the above materials, but are not limited thereto.

Figure 4:
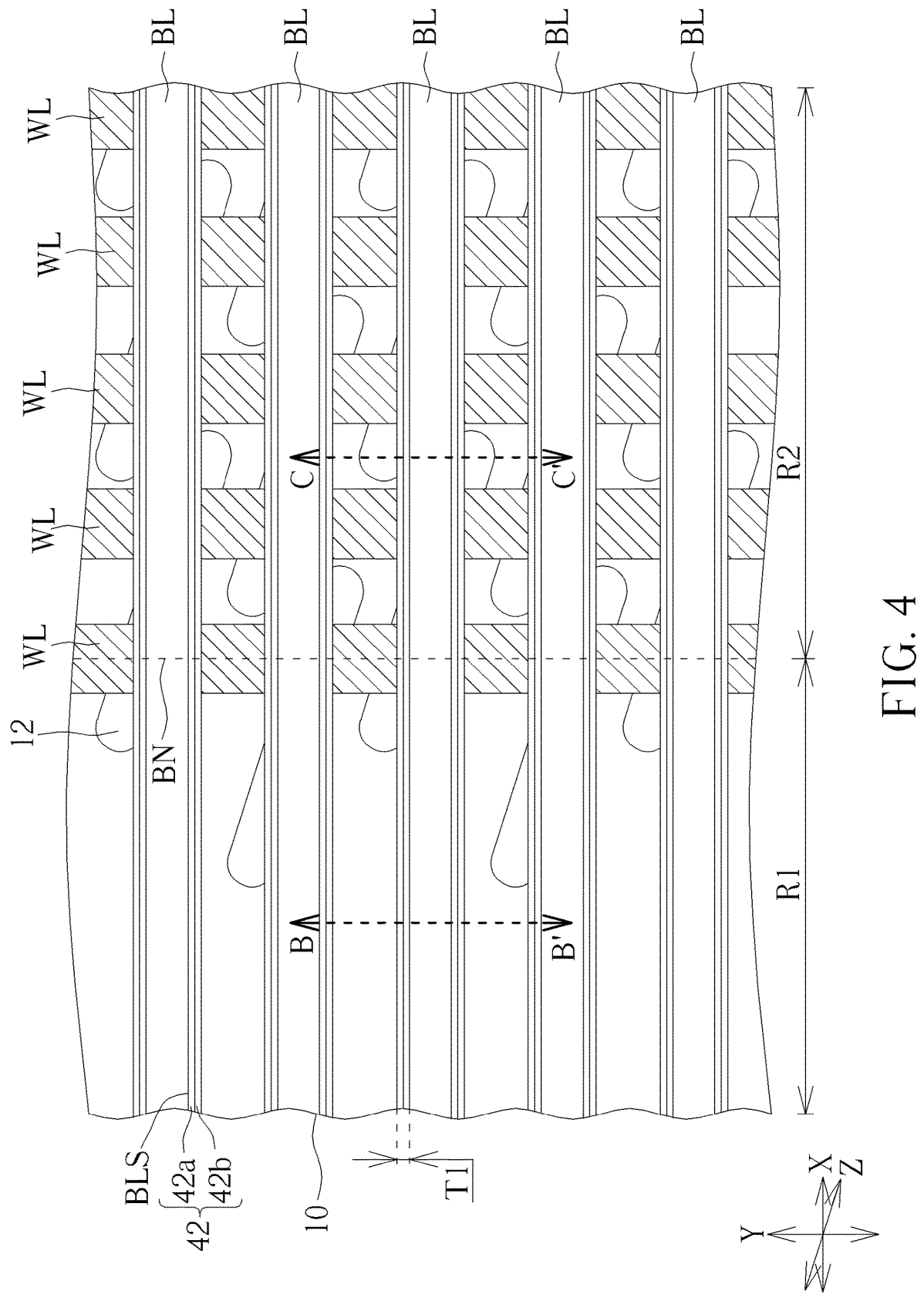
Figure 5:
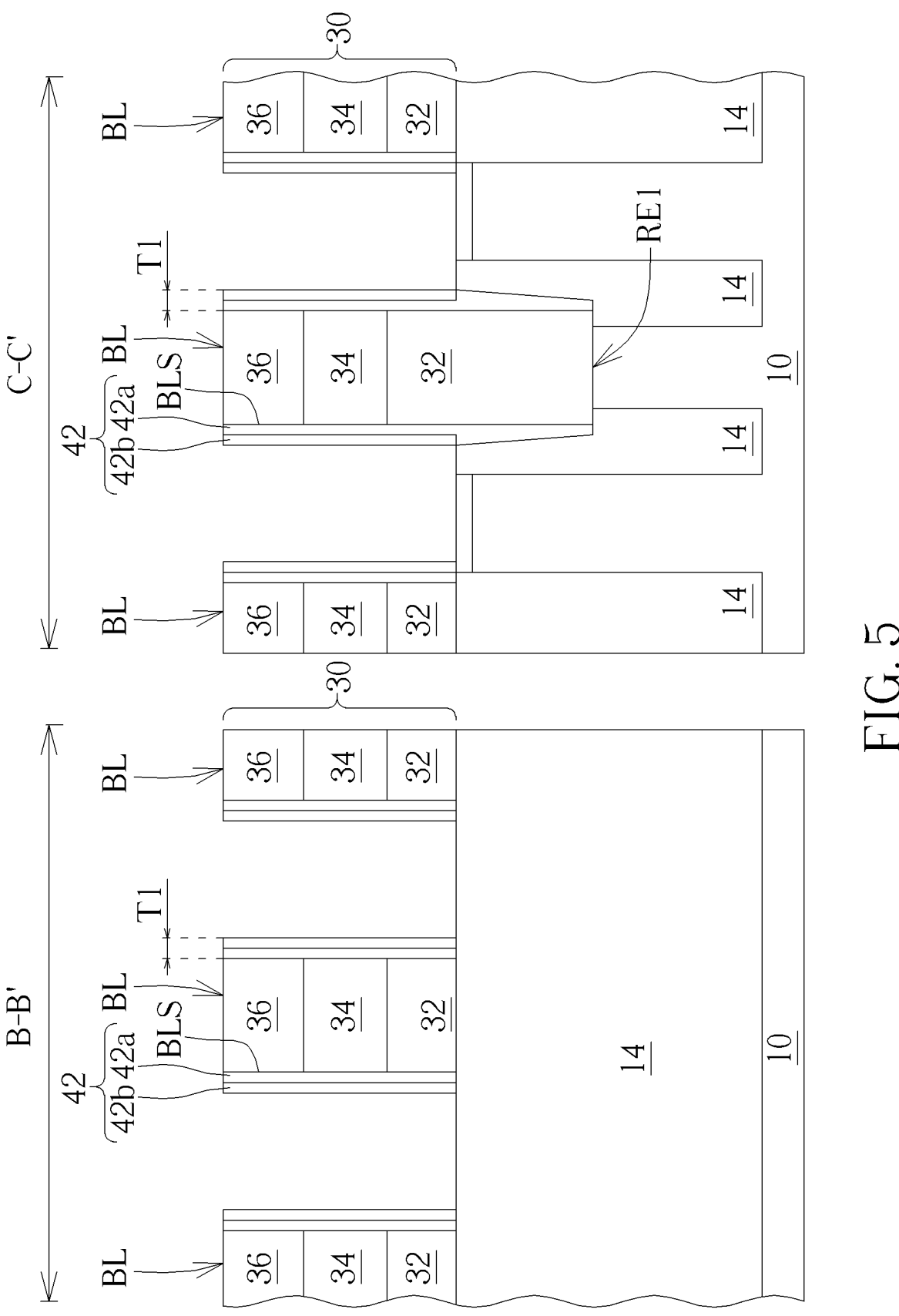

Please refer to FIG. 4 and FIG. 5. Subsequently, a plurality of bit lines BL are formed on the substrate 10, and sidewall spacers 42 are formed along the sidewalls BLS of the bit lines BL. The bit lines BL respectively extend along the X direction and pass through the peripheral region R1 and the memory region R2, and are arranged in parallel along the Y direction. The middle portions 12*a* of the active regions 12 are respectively overlapped and electrically contacted with one of the bit lines BL. The terminal portions 12*b* of the active regions 12 are exposed from the spaces between the bit lines BL. According to an embodiment of the present invention, the process for forming the bit lines BL may include the following steps. First, the middle portions 12*a* of the active regions 12 and the isolation structures 14 near the middle portions 12*a* are etched to form a plurality of recesses RE1. Subsequently, a stack material 30 is formed to completely cover the substrate 10 and fill the recesses RE1. Next, the unnecessary portions of the stack material 30 are etched and removed to form the bit lines BL. In one embodiment of the present invention, the stack material 30 is formed by stacking, from bottom to top, a semiconductor layer 32, a metal layer 34, and a hard mask layer 36. The material of the semiconductor layer 32 may include polycrystalline silicon, amorphous silicon, or other suitable semiconductor materials. The material of the metal layer 34 may include aluminum (Al), tungsten (W), copper (Cu), titanium-aluminum (TiAl) alloy, or other suitable low-resistance metal materials. The hard mask layer 36 may include a dielectric material, such as silicon oxide (SiO₂), silicon nitride (SiN), silicon oxynitride (SiON), silicon carbide nitride (SiCN), or a combination thereof, but is not limited thereto. In some embodiments, an interfacial layer (not shown in the figures) may be formed between the semiconductor layer 32 and the metal layer 34. The interfacial layer may include a single layer or multiple stacked layers made of materials such as titanium (Ti), tungsten silicide (WSi), tungsten nitride (WN), and/or other metal silicides or metal nitrides, but is not limited thereto.

Please continue to refer to FIG. 4 and FIG. 5. After forming the bit lines BL, a conformal dielectric layer (not shown) is formed along the sidewalls BLS and top surfaces of the bit lines BL, and fills the portions of the recesses RE1 exposed from the bottom of the bit lines BL. An anisotropic etching process is performed to etch and remove excess portions of the dielectric layer, thereby forming the sidewall spacers 42 that are self-aligned to sidewalls BLS of the bit lines BL. According to an embodiment of the present invention, each sidewall spacer 42 has a multi-layered structure, which may include a first insulating layer 42a and a second insulating layer 42b on the first insulating layer 42a, wherein the first insulating layer 42a is in direct contact with the sidewall BLS of one of the bit lines BL and the surfaces of the recesses RE1 adjacent to the sidewall BLS of the bit line BL. The first insulating layer 42a and the second insulating layer 42b respectively include a dielectric material, such as silicon oxide (SiO2), silicon nitride (SiN), silicon oxynitride (SiON), silicon carbide (SiCN), or a combination thereof, but are not limited thereto. In an embodiment of the present invention, the material of the first insulating layer 42a includes silicon nitride (SiN), and the material of the second insulating layer 42b includes silicon oxide (SiO2). It is noteworthy that, at the manufacturing step as shown in FIG. 4 and FIG. 5, the sidewall spacers 42 are uniform along the first direction X and have a same thickness T1 (the sum of the thickness of the insulating layer 42a and the second insulating layer 42b).

Figure 6:
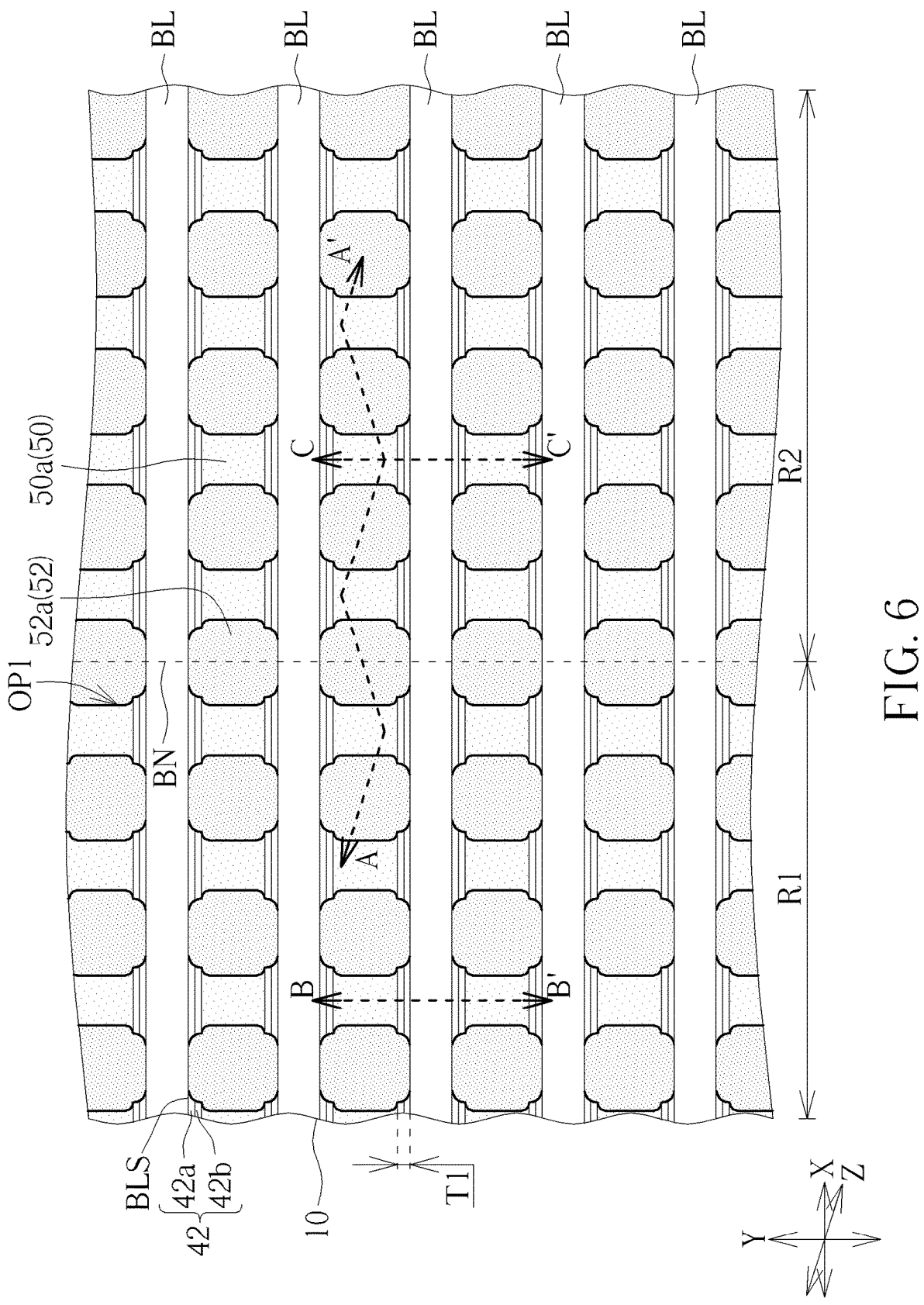
Figure 7:
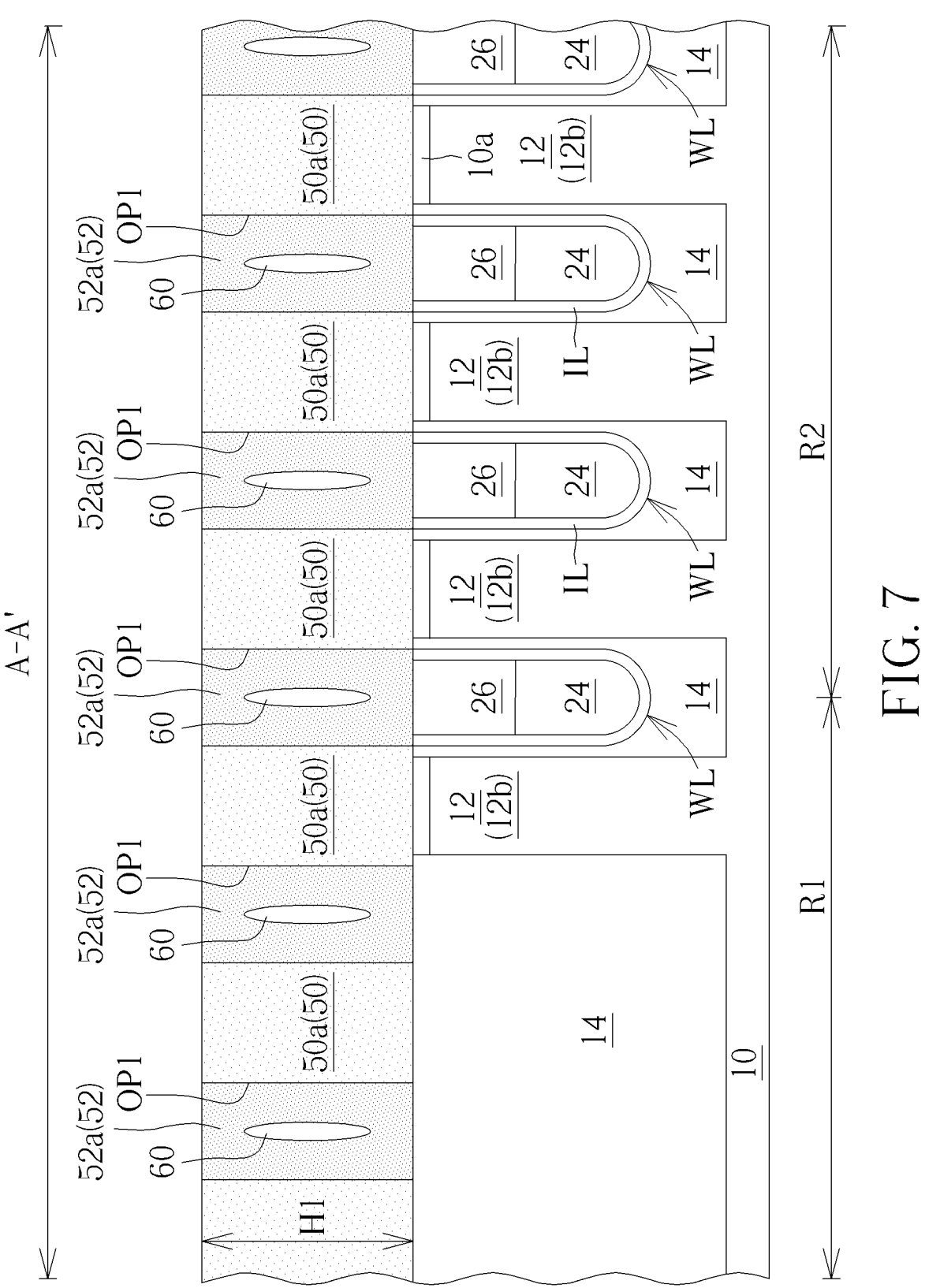
Figure 8:
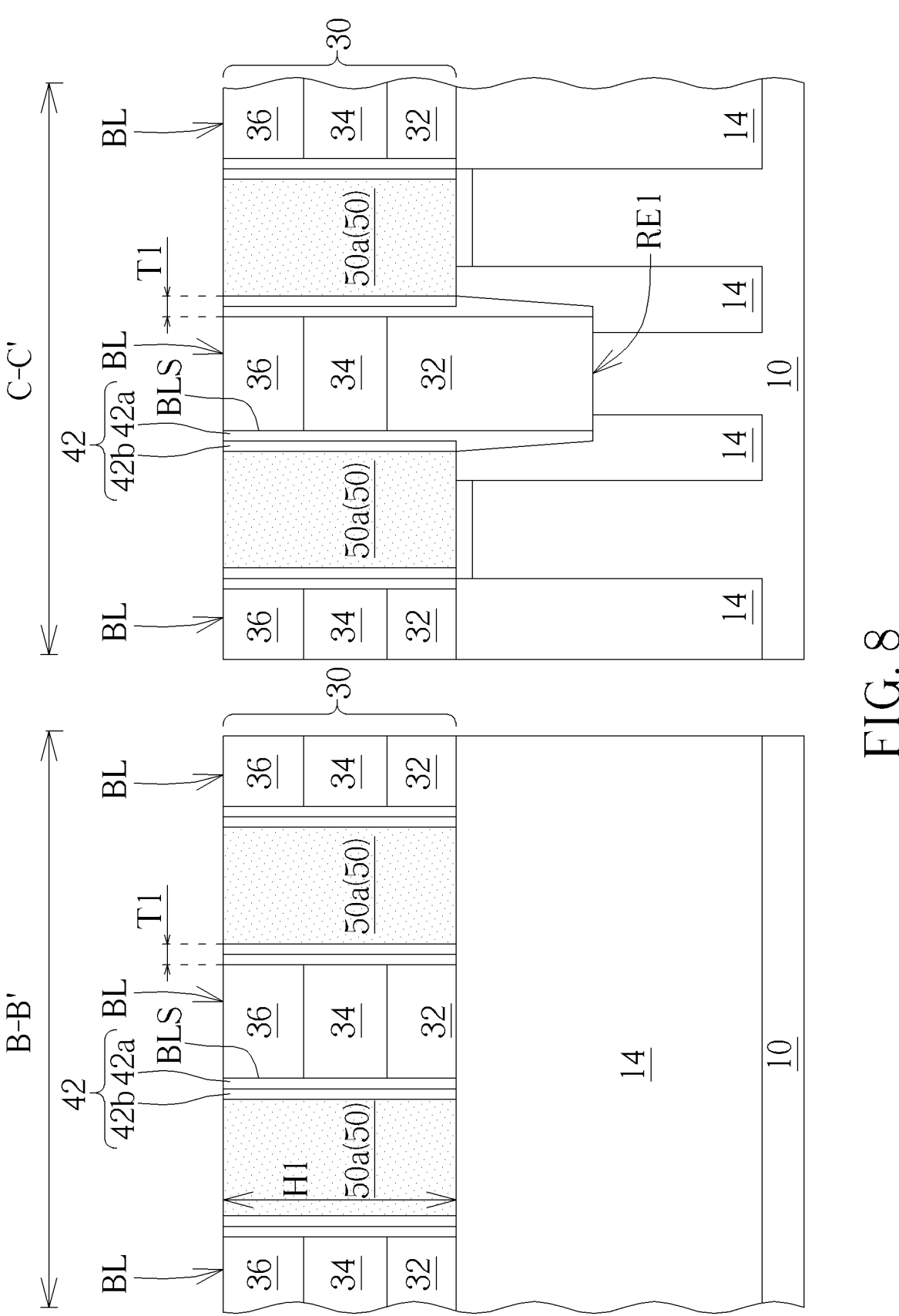

Please refer to FIG. 6, FIG. 7 and FIG. 8. Subsequently, a first dielectric material 50 is formed on the substrate 10 to fill the spaces between the bit lines BL. A patterning process such as a photo-lithography etching process is performed to remove portions of the first dielectric material 50 and form a plurality of first openings OP1 in the first dielectric material 50, thereby dividing the first dielectric material 50 into a plurality of separate insulating plugs 50a. Next, a second dielectric material 52 is formed on the substrate 10, completely covering the bit lines BL, the insulating plugs 50a and filling the first openings OP1. An etching back process or a chemical mechanical polishing process is performed to remove the second dielectric material 52 outside the first openings OP1, such that a plurality of first spacer structures 52a respectively disposed in the first openings OP1 and alternately arranged with the insulating plugs 50a may be obtained. The insulating plugs 50a and the first spacer structures 52a include different dielectric materials to allow the selective removal of some of the insulating plugs 50a in subsequent processes. According to an embodiment of the present invention, the insulating plugs 50a (made from the first dielectric material 50) include silicon oxide (SiO₂). The first spacer structures 52a (made from the second dielectric material 52) include silicon nitride (SiN). As shown in FIG. 7 and FIG. 8, the insulating plugs 50a, the first spacer structures 52a and the bit lines BL have approximately the same height H1 and the top surfaces are flush with each other.

Figure 15:
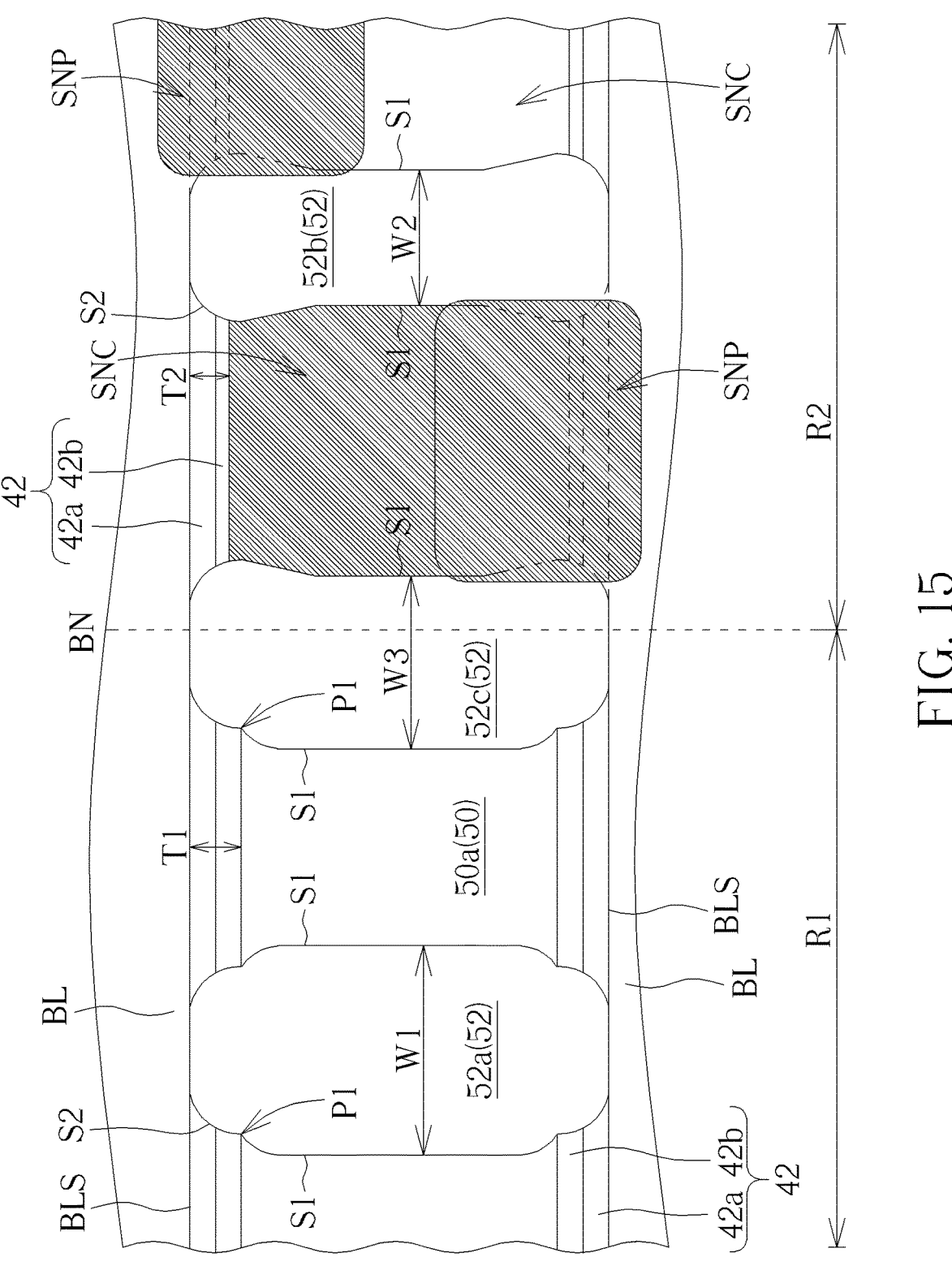

Please continue to refer to FIG. 6 and FIG. 7, and also refer to the left portion of FIG. 15, which shows an enlarged view of one of the first spacer structure 52a. The first spacer structures 52a are equally spaced and aligned to each other along the X direction and the second direction Y to form an array pattern on the peripheral region R1 and the memory region R2. The first spacer structures 52a are arranged at a fixed pitch along the X direction, and the pitch of the first spacers 52a is substantially equal to the pitch between the word lines WL. The first spacer structures 52a on the memory region R2 are located directly above the word lines WL along the Y direction.

As shown in FIG. 6, the shape of each first spacer structure 52a is slightly elliptical, with the portions at the two ends of the long axis extending into the sidewall spacers 42 as shown in the plane view of FIG. 6. In some embodiments, the portions at the two ends of the long axis of each first spacer structure 52a extend through the entire thickness of the sidewall spacers 42 and directly contact the sidewalls BLS of the bit lines BL. It is noteworthy that, in some cases the differences in materials and/or material densities of the first dielectric material 50 and the sidewall spacers 42 may cause differences in etching behaviors when forming the first openings OP1, resulting in that the edges of the first openings OP1 that expose the first dielectric material 50 and the edges of the first openings OP1 that expose the sidewall spacers 42 having different curved profiles. Therefore, the edges of the first spacer structures 52a that contact the first dielectric material 50 and the edges of the first spacer structures 52a that contact the sidewall spacers 42 may also have different curved profiles. As shown on the left portion of FIG. 15, the edges S1 of the first spacer structure 52a that contact the insulating plugs 50a and the edges S2 of the first spacer structure 52a that contact the sidewall spacers 42 have different convex curved profiles and are jointed at the notch portions P1, collectively forming a non-smooth edge profile of the first spacer structure 52a. The distance between the edges S1 of the first spacer structure 52a is defined as the width W1 of the first spacer structure 52a. In the embodiment as shown in FIG. 7, air gaps 60 may be formed in the first spacer structure 52a and sealed by the second dielectric material 52.

Next, a replacement process may be performed to replace the insulating plugs 50a on the memory region R2 with conductive plugs SNC. Please refer to the following description for detailed steps of the replacement process.

Figure 9:
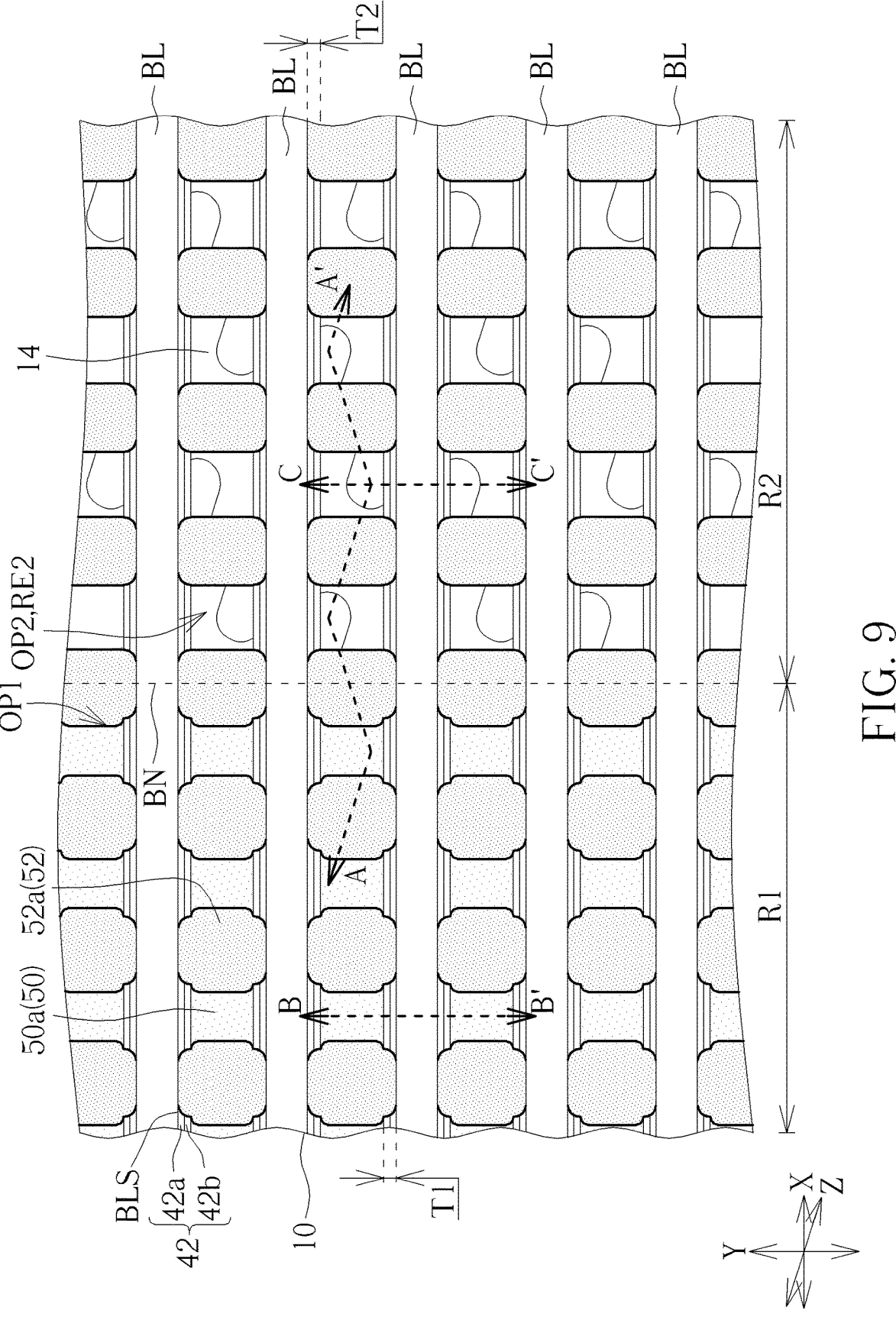
Figure 10:
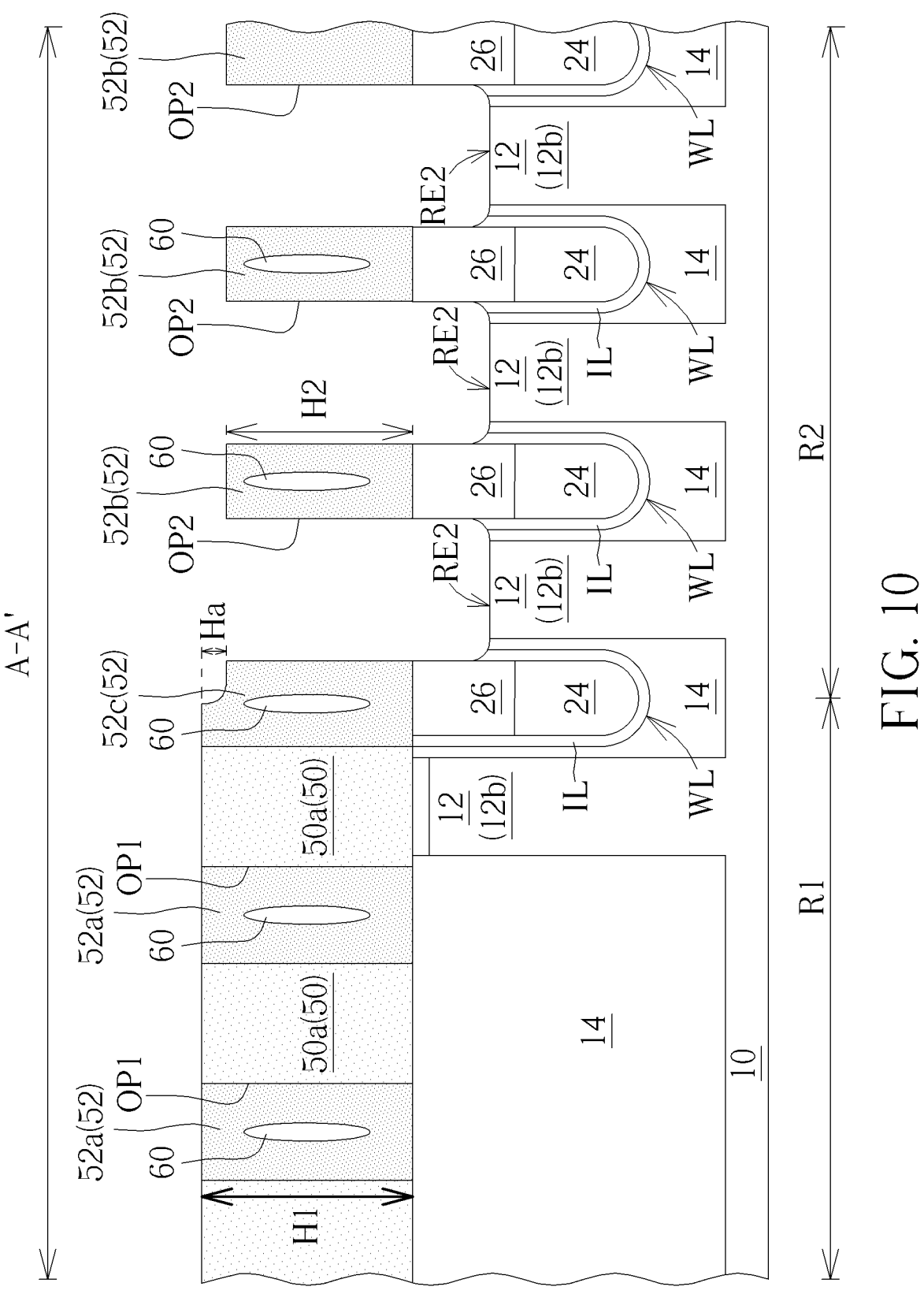
Figure 11:
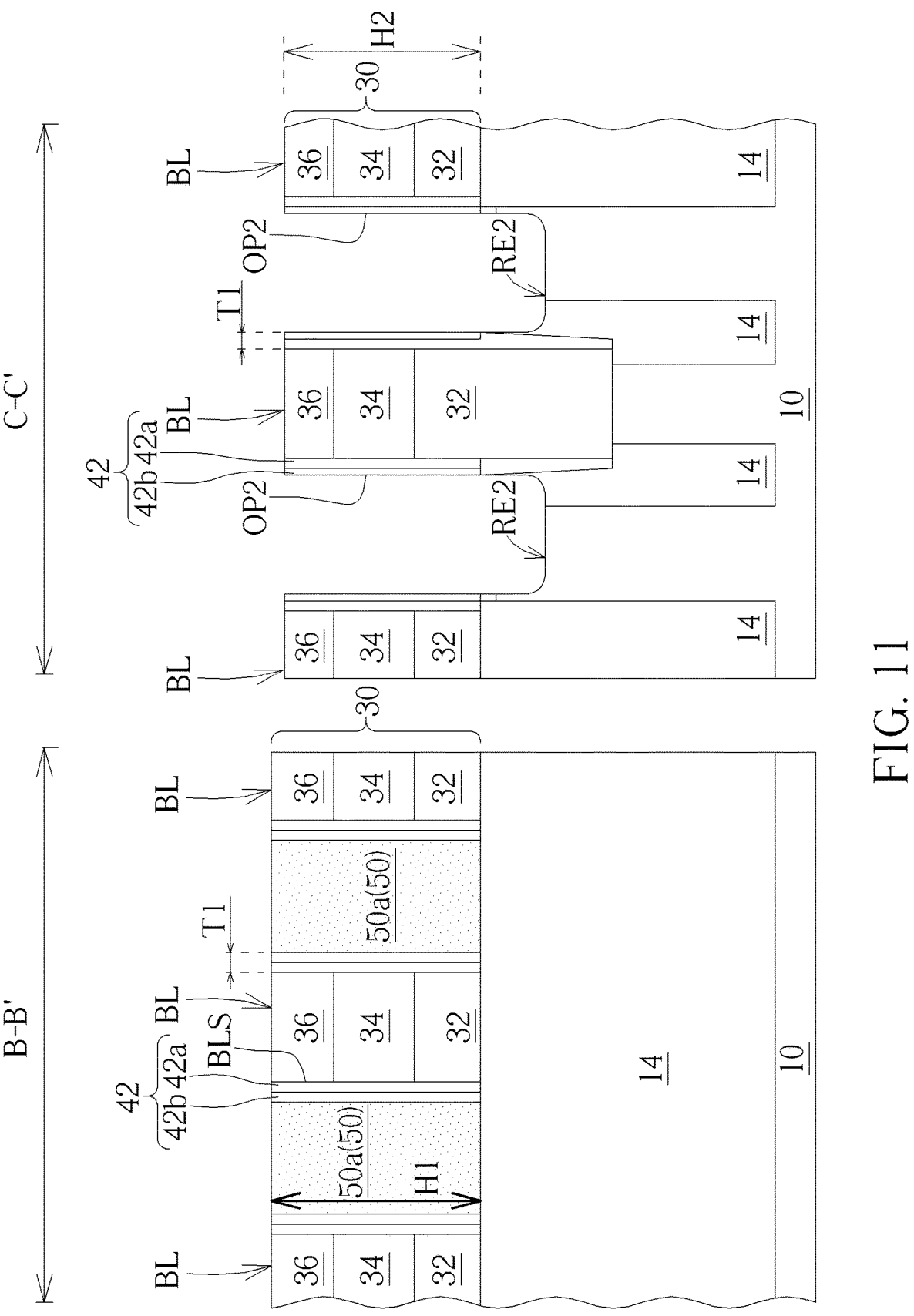
Figure 12:
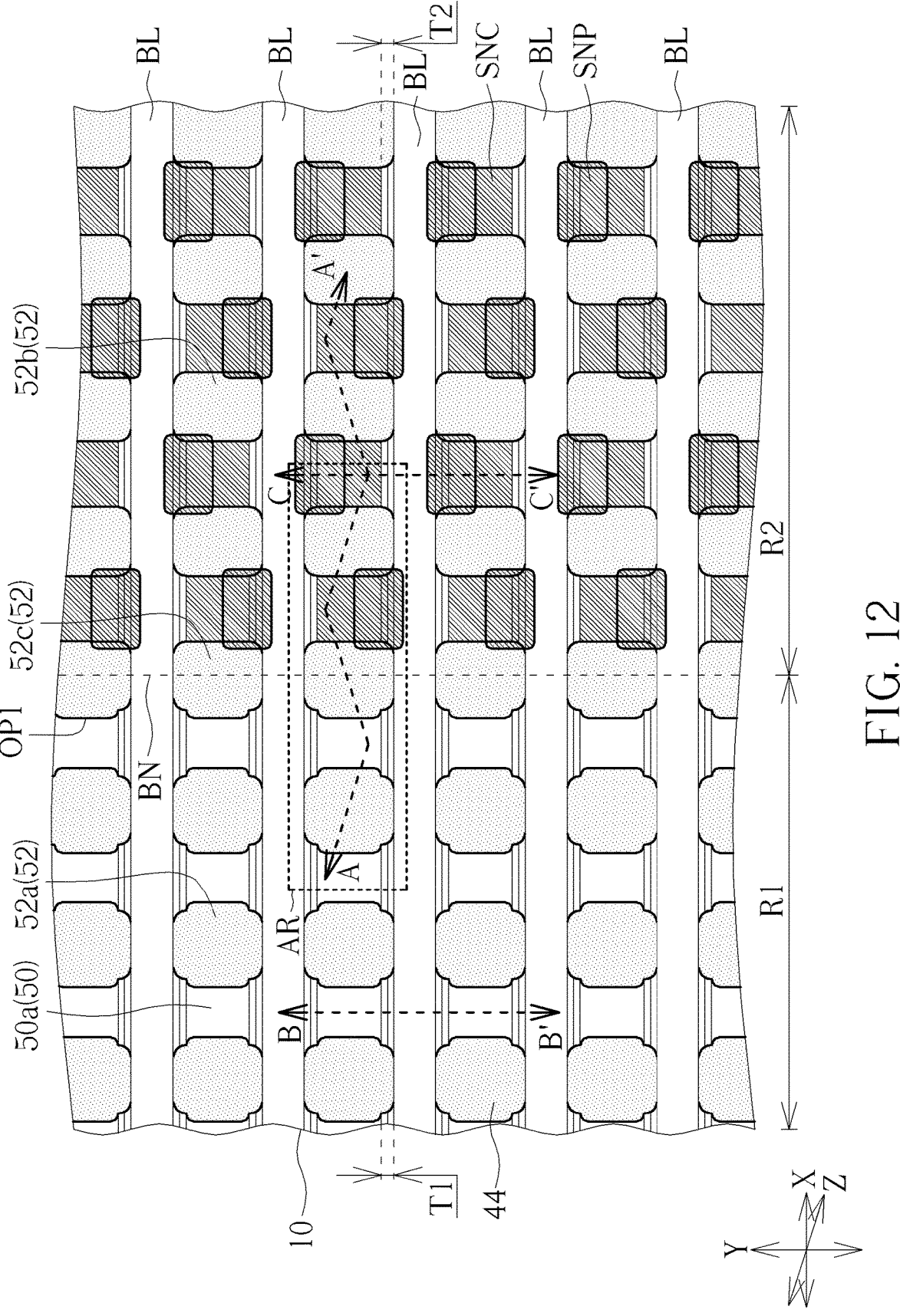

Please refer to FIG. 9, FIG. 10 and FIG. 11. After forming a mask layer (not shown) to cover the peripheral region R1, an etching process is performed to selectively remove the insulating plugs 50a on the memory region R2, thereby forming a plurality of second openings OP2 between the first spacer structure 52a. Subsequently, another etching process is performed to etch the exposed portions of the terminal portions 12b of the active regions 12 and the isolation structures 14 through the second openings OP2 to form a plurality of recesses RE2. The remaining mask layer (not shown) on the peripheral region R1 is then removed.

Please continue to refer to FIG. 9, FIG. 10 and FIG. 11, and also refer to the middle portion and right portion of FIG. 15, which are enlarged views of a second spacer structure 52b and a third spacer structure 52c. During the etching processes to form the second openings OP2 and the recesses RE2, the sidewalls of the first spacer structures 52a exposed from the second openings OP2 may be partially etched to further enlarge the dimensions of the second openings OP2 and increase the exposed areas of the terminal portions 12b of the active regions 12. The first spacer structures 52a on the memory region R2 become the second spacer structures 52b with smaller widths after the above etching processes. As shown in FIG. 15, the distance between the middle portions of the edges S1 of the second spacer structure 52b are defined as the width W2 of the second spacer structure 52b, and the width W2 is smaller than the width W1 of the first spacer structure 52a. As shown on the right portion of FIG. 15, the edges S1 of the second spacer structures 52b may have concave curved profiles. In some embodiments, the top portions of the first spacer structures 52a and the top portions of the bit lines BL (for example, the hard mask layers 36 of the bit lines BL) may also be etched during the etching processes for forming the second openings OP2 and the recesses RE2. The height H2 of the second spacer structures 52b are smaller than the height H1 of the first spacer structures 52a.

In some embodiments of the present invention, the first spacer structures 52a that are arranged on the boundary region BN have the edges at the side on the memory region R2 that are exposed and etched during the etching processes for forming the second openings OP2 and the recesses RE2, while the edges at the side on the peripheral region R1 are covered by the mask layer (not shown) and are not etched. As a result, the first spacer structures 52a on the boundary region BN are etched into third spacer structures 52c that have asymmetrical edge profiles. As shown on the middle portion of FIG. 15, the edge S1 of the third spacer structure 52c near the peripheral region R1 has a convex curved profile, and the edge S1 of the third spacer structure 52c near the memory region R2 has concave curved profile. The distance between the middle portions of the edges of the third spacer structure 52c is defined as the width W3 of the third spacer structure 52c, which is larger than the width W2 of the second spacer structure 52b and smaller than the width W1 of the first spacer structure 52a. The portions of the third spacer structure 52c near the peripheral region R1 and near the memory region R2 may respectively have the height H1 and the height H2, such that the top surface of the third spacer structure 52c may have a step height Ha.

Please refer to FIG. 12, FIG. 13, FIG. 14, and FIG. 15. Subsequently, a conductive material is formed on the substrate 10 and completely covers the bit lines BL, the first spacer structures 52a, the second spacer structures 52b, and the third spacer structures 52c, and completely fills the second openings OP2. After that, a recess etching process is performed on the conductive material to completely remove the conductive material on the peripheral region R1 and divide the conductive material on the memory region R2 into a plurality of conductive plugs SNC that are filled in the second openings OP2 and a plurality of contact pads SNP respectively located on the conductive plugs SNC. The conductive material may include a plurality of semiconductor layers 62 filled in the bottom portions of the second openings OP2 and in direct contact with the terminal portion 12b of the active regions 12, a liner 64 conformally covering the top surfaces of the semiconductor layers 62, the sidewalls of the second openings OP2, and the top surfaces of the bit lines BL, the first spacer structures 52a, the second spacer structures 52b, and the third spacer structures 52c, and a metal layer 66 on the liner 64 to completely fill the remaining spaces of the second openings OP2. The material of the semiconductor layers 62 may include crystalline silicon, poly silicon, amorphous silicon, doped silicon, silicon germanium (SiGe), or other suitable semiconductor materials. The materials of the liner 64 and the metal layer 66 may respectively include tungsten (W), copper (Cu), aluminum (Al), titanium (Ti), tantalum (Ta), nitrides, silicides, alloys or composite layers of the above materials, but are not limited thereto. According to an embodiment of the present invention, the material of the semiconductor layers 62 includes phosphorus (P) doped silicon, the material of the liner 64 includes titanium nitride (TiN), and the material of the metal layer 66 includes tungsten (W).

Figure 13:
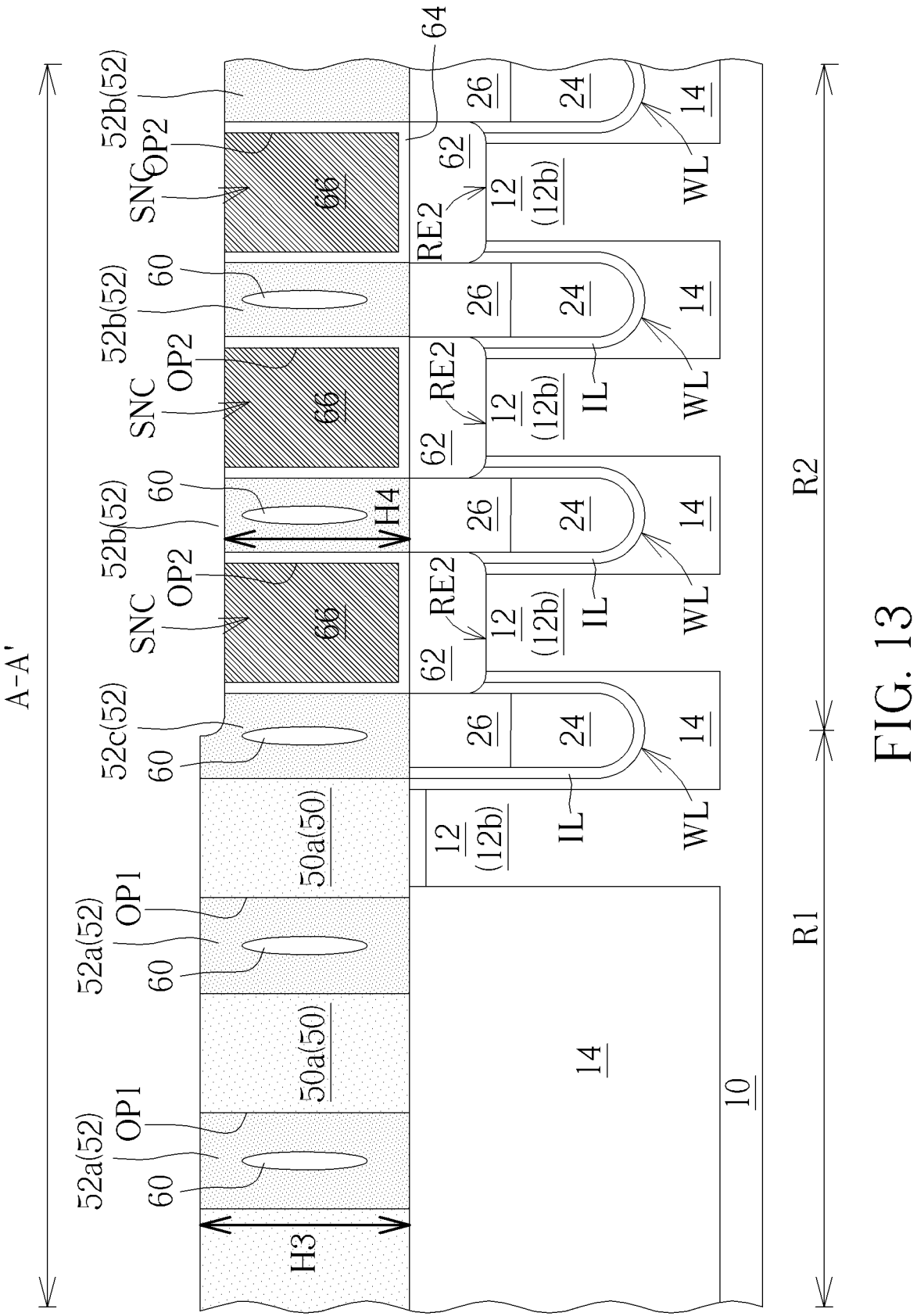
Figure 14:
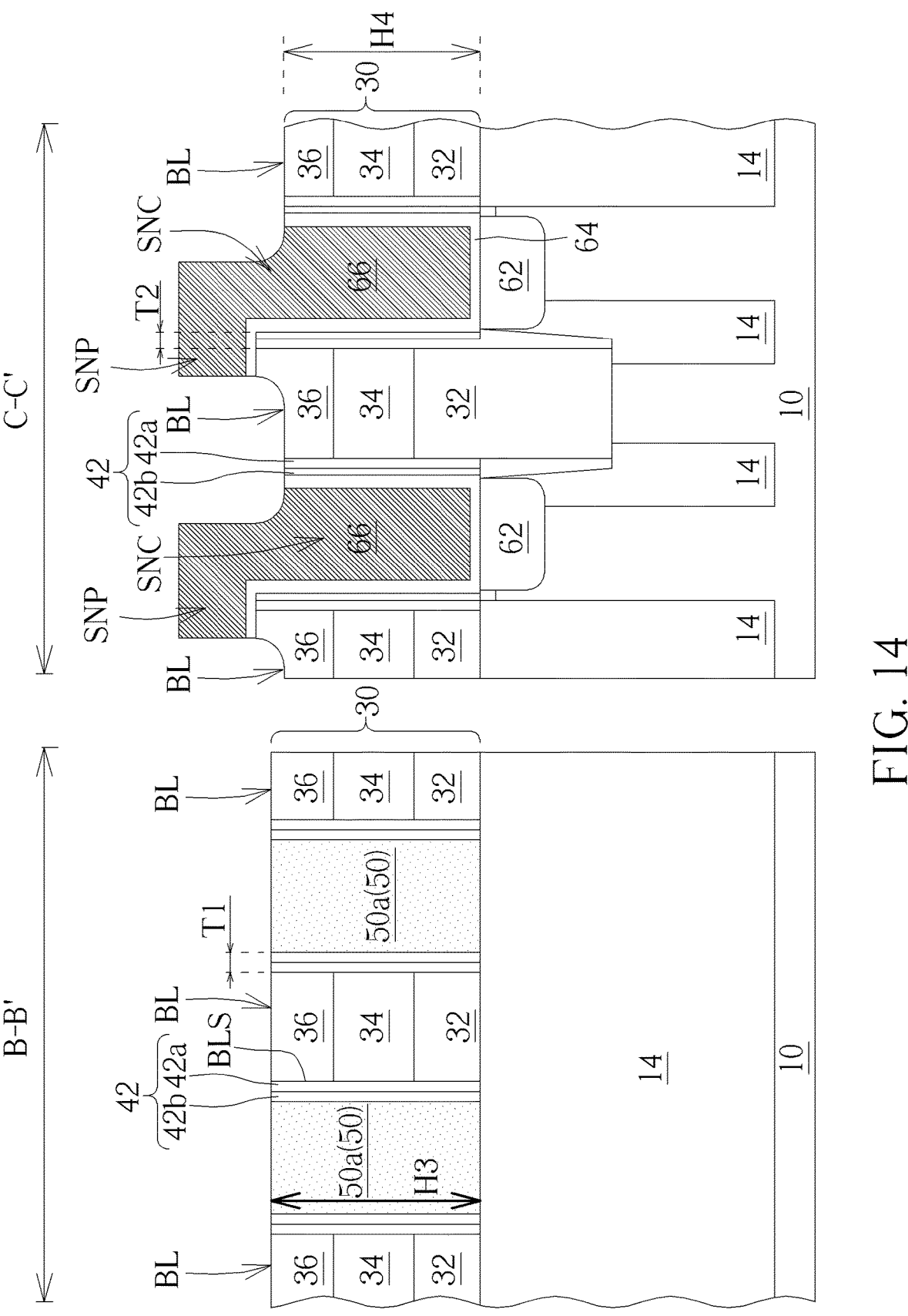

As shown in FIG. 13 and FIG. 14, the insulating plugs 50a, the first spacer structures 52a and the portions of bit lines BL on the peripheral region R1 approximately have the same height H3, and the top surfaces are flush with each other. The second spacer structures 52b and the portions of the bit lines BL not covered by the contact pads SNP approximately have the same height H4. The top surfaces of the second spacer structures 52b, the conductive plugs SNC and the portions of the bit lines BL not covered by the contact pads SNP are flush with each other.

In some embodiments, the recess etching process may over-etch the top portions of the insulating plugs 50a and the first spacer structures 52a on the peripheral region R1 and the top portions of the second spacer structures 52b, the third spacer structures 52c and bit lines BL on the memory region R2 which are not covered by the contact pads SNP, to ensure that the conductive material on the peripheral region R1 may be completely removed and the contact pads SNP on the memory region R2 may be fully separated. Accordingly, the height H3 is smaller than the height H1, and the height H4 is smaller than the height H2 and the height H1. The top surfaces of the second spacer structures 52b are lower than the top surfaces of the insulating plugs 50a and the first spacer structures 52a.

Each conductive plug SNC may be divided into a lower portion and an upper portion. The lower portion of the conductive plug SNC includes the semiconductor layer 62 that is in direct contact and electrically connected to a terminal portion 12b of one of the active regions 12. The upper portion of the conductive plug SNC and the above contact pad SNP have a one-piece monolithic construction including the metal layer 66.

The contact pads SNP are disposed on the conductive plugs SNC and offset in a direction toward adjacent bit lines BL, partially overlapping the top surfaces of the bit line BL, the second spacer structures 52b and the third spacer structures 52c, to form an array that are equally spaced from each other for the convenience of forming electrical connections with the storage nodes (such as stacked capacitors) formed in later process.

In some embodiments, as shown in FIG. 15, during the etching process for forming the second openings OP2 and the recesses RE2, the portions of the of the sidewall spacers 42 (such as the second insulating layer 42b) exposed from the second openings OP2 will also be partially etched to a thinner thickness. Therefore, the thickness T2 of the portions of the sidewall spacers 42 between the conductive plugs SNC and sidewalls BLS of the bit lines BL may be smaller than the thickness T1 of the portions of the sidewall spacers 42 between the insulating plugs 50a and the sidewalls of the bit lines BL.

After completing the above manufacturing process, the semiconductor structure provided by the present invention is obtained. Further manufacturing process may be carried out to form storage nodes (such as stacked capacitors) on the contact pads SNP to form a dynamic random access memory (DRAM) device. In conclusion, the method for form the semiconductor structure provided by the present invention includes forming alternately arranged insulating plugs 50a and first spacer structures 52a between the bit lines BL on the peripheral region R1 and the memory region R2, and performing a replacement process to selectively remove and replace the insulating plugs 50*a* on the memory region R2 with the conductive plugs SNC. It is noteworthy that, the etching process to remove the insulating plugs 50*a* concurrently etches away portions of the exposed first spacer structures 52*a* and the sidewall spacers 42, so that the dimensions of the openings (the second openings OP2) for forming the conductive plugs SNC may be enlarged. The resulting dimensions (such as the length and width in the Y and X directions in the plane view) of the conductive plugs SNC are larger than the dimensions originally defined by the insulating plugs 50*a*. In this way, the resistance between the storage nodes (such as stacked capacitors) and the terminal portions 12*a* of the active regions 12 may be reduced to improve the electrical connection quality. It is also noteworthy that the method provided by the present invention may obtain the insulating plugs 50*a* and the conductive plugs SNC of different dimensions by only performing a patterning process (such as a photo-lithography etching process) to define the first opening OP1, which may simplify the manufacturing process. Furthermore, since the first openings OP1 are formed with the same dimensions and arranged uniformly on the peripheral region R1 and the memory region R2, the influences caused by different pattern densities and pattern dimensions on the peripheral region R1 and the memory region R2 on the patterning process may be eliminated, so that consistent dimensions, shapes and locations of the first openings OP1 and the first spacer structures 52*a* formed in the first openings OP1 may be ensured. The second spacer structures 52*b* and the third spacer structures 52*c* formed by following replacement process may also have desired dimensions, shapes and locations, and the electrical isolation between conductive plugs SNC may be guaranteed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate comprising a peripheral region and a memory region;
a plurality of bit lines disposed on the substrate, extending along a first direction to pass through the peripheral region and the memory region, and arranged in parallel along a second direction, wherein the first direction and the second direction are is perpendicular;
a plurality of insulating plugs and first spacer structures alternately arranged along the first direction between the bit lines on the peripheral region; and
a plurality of conductive plugs and second spacer structures alternately arranged along the first direction between the bit lines on the memory region, wherein the first spacer structures and the second spacer structures comprise a same material, and along the first direction, widths of the second spacer structures are smaller than widths of the first spacer structures.

2. The semiconductor structure according to claim 1, wherein edges of the first spacer structures that contact the insulating plugs respectively have a convex curved profile, and edges of the second spacer structures that contact the conductive plugs respectively have a concave curved profile.

3. The semiconductor structure according to claim 1, further comprising a plurality of third spacer structures disposed on a boundary region between the peripheral region and the memory region along the second direction, wherein along the first direction, width of the third spacer structures are smaller than the widths of the first spacer structures, and are larger than the widths of the second spacer structures.

4. The semiconductor structure according to claim 3, wherein each of the third spacer structures comprises an edge in contact with one of the insulating plugs and having a convex curved profile, and another edge in contact with one of the conductive plugs and having a concave curved profile.

5. The semiconductor structure according to claim 1, wherein top surfaces of the second spacer structures are lower than the top surfaces of the first spacer structures.

6. The semiconductor structure according to claim 1, further comprising a plurality of sidewall spacers disposed along sidewalls of the bit lines, wherein thicknesses of portions of the sidewall spacers between the conductive plugs and the bit lines are smaller than thicknesses of portions of the sidewall spacers between the insulating plugs and the bit lines.

7. The semiconductor structure according to claim 6, wherein the first spacer structures and the second spacer structures respectively extend through the sidewall spacers to directly contact the sidewalls of the bit lines.

8. The semiconductor structure according to claim 6, wherein edges of the first spacer structures in contact with the insulating plugs and edges of the first spacer structures in contact with the sidewall spacers are jointed at notch portions of the first spacer structures.

9. The semiconductor structure according to claim 1, wherein the first spacer structures and the second spacer structures respectively comprise an air gap.

10. The semiconductor structure according to claim 1, wherein the first spacer structures and the second spacer structures comprise silicon nitride, the insulating plugs comprise silicon oxide, the conductive plugs respectively comprise a lower portion comprising poly silicon and an upper portion comprising tungsten.

11. The semiconductor structure according to claim 1, further comprising:
a plurality of active regions disposed in the memory region of the substrate, respectively having a length extending along a third direction and being arranged into a staggered array, wherein the third direction is different from the first direction and the second direction; and
a plurality of word lines disposed in the substrate, extending along the second direction and parallel to each other along the first direction to divide each of the active regions into a middle portion and two terminal portions, wherein the second spacer structures are aligned along the second direction and located directly above the word lines, the middle portions of the active regions are respectively in electrical contact with the bit lines, and the terminal portions of the active regions are respectively in electrical contact with the conductive plugs.

* * * * *